US006812073B2

(12) United States Patent
Bu et al.

(10) Patent No.: US 6,812,073 B2
(45) Date of Patent: Nov. 2, 2004

(54) SOURCE DRAIN AND EXTENSION DOPANT CONCENTRATION

(75) Inventors: Haowen Bu, Plano, TX (US); Amitabh Jain, Allen, TX (US); Wayne A. Bather, Richardson, TX (US); Stephanie Watts Butler, Richardson, TX (US)

(73) Assignee: Texas Instrument Incorporated, Dallas, TX (US)

( * ) Notice: Subject to any disclaimer, the term of this patent is extended or adjusted under 35 U.S.C. 154(b) by 26 days.

(21) Appl. No.: 10/316,468

(22) Filed: Dec. 10, 2002

(65) Prior Publication Data

US 2004/0110352 A1 Jun. 10, 2004

(51) Int. Cl.⁷ .......................... H01L 21/00; H01L 21/84; H01L 21/8238; H01L 21/336
(52) U.S. Cl. ........................ 438/151; 438/231; 438/287
(58) Field of Search ................................ 438/151, 231, 438/287, 289, 238, 301, 303, 304, 305, 236

(56) References Cited

U.S. PATENT DOCUMENTS

| | | | | |
|---|---|---|---|---|
| 5,900,666 A | * | 5/1999 | Gardner et al. ............... | 257/401 |
| 5,989,966 A | * | 11/1999 | Huang ......................... | 438/305 |
| 6,093,594 A | * | 7/2000 | Yeap et al. .................. | 438/231 |
| 6,093,610 A | * | 7/2000 | Rodder ........................ | 438/289 |
| 6,107,130 A | * | 8/2000 | Fulford et al. ............... | 438/231 |
| 6,261,913 B1 | * | 7/2001 | Akram et al. ................ | 438/305 |
| 6,274,446 B1 | * | 8/2001 | Agnello et al. .............. | 438/304 |
| 6,329,225 B1 | * | 12/2001 | Rodder ........................ | 438/151 |
| 6,383,881 B1 | * | 5/2002 | Akram et al. ................ | 438/303 |
| 6,387,761 B1 | * | 5/2002 | Shih et al. ................... | 438/287 |
| 6,407,436 B1 | * | 6/2002 | Agnello et al. .............. | 438/305 |
| 6,448,143 B1 | * | 9/2002 | Akram et al. ................ | 438/305 |
| 6,489,207 B2 | * | 12/2002 | Furukawa et al. ........... | 438/301 |
| 6,507,123 B1 | * | 1/2003 | Woo et al. ................... | 257/401 |
| 6,555,438 B1 | * | 4/2003 | Wu ............................. | 438/305 |
| 6,563,152 B2 | * | 5/2003 | Roberds et al. .............. | 257/288 |
| 6,635,540 B2 | * | 10/2003 | Akram et al. ................ | 438/303 |
| 6,638,807 B2 | * | 10/2003 | Forbes et al. ................ | 438/236 |
| 6,642,119 B1 | * | 11/2003 | Pelella et al. ................ | 438/303 |

OTHER PUBLICATIONS

Patent pending application entitled, "Sidewall Processes using Alkylsilane Precursors for MOS Transistor Fabrication", by Haowen Bu et al., (TI–34231), 17 pages, filed Sep. 26, 2002.
Patent pending application entitled, "Thermal CVD Oxynitride and BTBAS Nitride Sidewall Spacer for Metal Oxide Semiconductor Transistors," by Haowen Bu et al., (TI–34612), 15 pages, filed Oct. 1, 2002.

* cited by examiner

Primary Examiner—John F. Niebling
Assistant Examiner—Walter L. Lindsay, Jr.
(74) Attorney, Agent, or Firm—Peter K. McLarty; W. James Brady, III; Frederick J. Telecky, Jr.

(57) ABSTRACT

A method of forming a semiconductor device includes forming one or more sidewall spacer layers on the outer surface of a gate stack. At least one region of an at least partially formed semiconductor device is doped. First and second sidewall bodies are formed on opposing sides of the gate stack. The formation of the first and second sidewall bodies includes forming a first sidewall-forming layer on the outward surface of the gate stack and the sidewall spacer layers, exposing the semiconductor device to a heating cycle in a single wafer reactor, and forming a second sidewall-forming layer on the outward surface of the first sidewall-forming layer. The formation of the second sidewall-forming layer occurs in an environment that substantially minimizes dopant loss and deactivation in the at least one region of the partially formed semiconductor device.

12 Claims, 3 Drawing Sheets

US 6,812,073 B2

SOURCE DRAIN AND EXTENSION DOPANT CONCENTRATION

TECHNICAL FIELD OF THE INVENTION

This invention relates generally to the field of semiconductor devices and, more particularly, to improving source drain and extension dopant concentration.

BACKGROUND OF THE INVENTION

During the fabrication of certain types of semiconductor devices, extension and source drain regions may be sequentially implanted on either side of a gate stack formed on the surface of a semiconductor substrate. The area of the semiconductor substrate that lies between opposing source drain and source drain extension regions is a channel region. The source drain and source drain extension regions include a high concentration of dopant. High temperature processes, such as annealing, however, may cause the lateral migration of dopant species within the source drain and source drain extension regions and reduce the length of the channel region or otherwise degrade the performance of the device. Typically, the amount of lateral migration is proportional to junction depth of the source drain regions and may be approximately sixty percent of the junction depth.

Spacer layers can mask portions of the semiconductor device during formation of doped regions. Conventional methods of forming the spacer layers, however, often lead to dopant loss and degradation of a doped semiconductor gate and/or doped drain and source drain extension regions. Dopant loss and degradation can lead to an increase in sheet resistance and a lower semiconductor device drive current.

SUMMARY OF EXAMPLE EMBODIMENTS

In accordance with the present invention, disadvantages and problems associated with methods of forming spacer layers are reduced or eliminated.

According to one embodiment of the present invention, a method for forming a semiconductor device is disclosed which includes forming one or more sidewall spacer layers on the outer surface of a gate stack. At least one region of an at least partially formed semiconductor device is doped. First and second sidewall bodies are formed on opposing sides of the gate stack. The formation of the first and second sidewall bodies includes forming a first sidewall-forming layer on the outward surface of the gate stack and the sidewall spacer layers, exposing the semiconductor device to a short heating cycle in a single wafer reactor, and forming a second sidewall-forming layer on the outward surface of the first sidewall-forming layer. The formation of the second sidewall-forming layer occurs in an environment that substantially minimizes dopant loss and deactivation in the at least one region of the partially formed semiconductor device.

Depending on the specific features implemented, particular embodiments of the present invention may exhibit some, none, or all of the following technical advantages. A technical advantage of one exemplary embodiment of the present invention is that dopant loss and deactivation in the gate and/or drain and extension areas of a semiconductor device may be minimized. Another technical advantage is that transistor drive current may be improved. Additionally or alternatively, the gate to substrate capacitance of the semiconductor device may be improved. Accordingly, the resulting semiconductor device will be more reliable and operate in a more efficient manner.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF EXAMPLE EMBODIMENTS

In order to form an integrated circuit device such as a field effect transistor, various conductive and nonconductive layers are typically deposited or grown on a semiconductor substrate or other outer semiconductor layer. FIGS. 1A through 1E are cross-sectional views showing one example of a method of forming a portion of semiconductor structure 10. Semiconductor structure 10 may be used as a basis for forming any of a variety of semi-conductor devices, such as a bipolar junction transistor, a NMOS transistor, a PMOS transistor, a CMOS transistor, a diode, a capacitor, or other semiconductor based device. Particular examples and dimensions specified throughout this document are intended for exemplary purposes only, and are not intended to limit the scope of the present disclosure. Moreover, the illustration in FIGS. 1A through 1E are not intended to be to relative scale. Conventional semiconductor fabrication techniques for forming sidewall spacers include high thermal budget processes that may cause the diffusion and lateral migration of dopant in the various regions of the semiconductor device. Such diffusion and migration may cause increased junction capacitance, diode leakage, and/or increased source gate and drainage capacitance. According to various embodiments, however, the affects of dopant diffusion and migration may be greatly reduced or substantially limited.

Figure 1A:
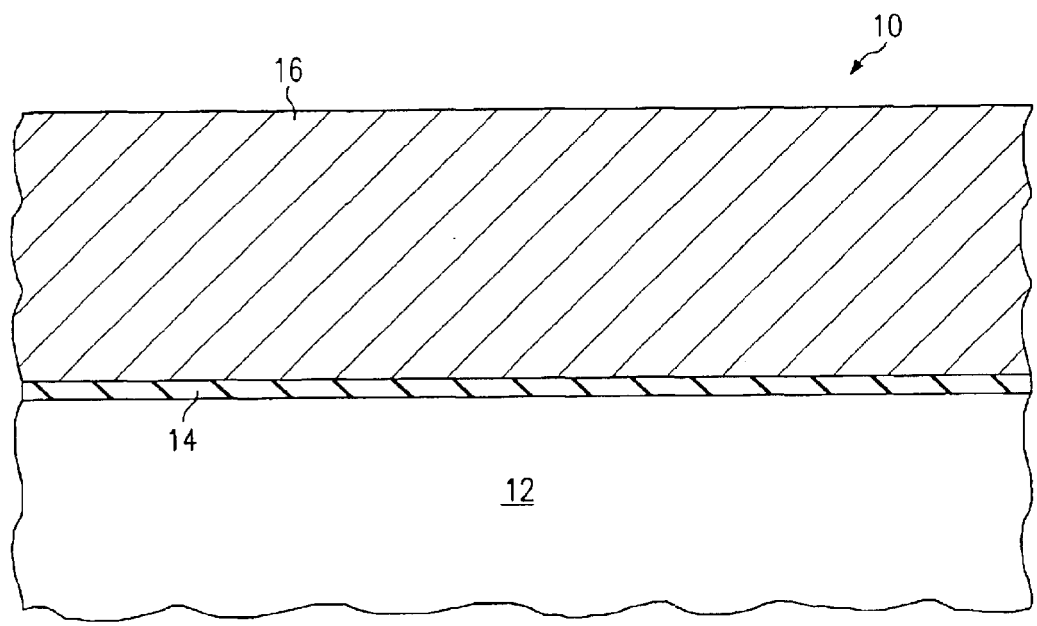
FIG. 1A is a cross-sectional view of a semiconductor structure after the formation of multiple layers on an outer surface of a semiconductor substrate.

FIG. 1A is a cross-sectional view of semiconductor structure 10 after the formation of multiple layers on an outer surface of a semiconductor substrate 12. A gate insulator layer 14 is formed outwardly from semiconductor substrate 12, and a gate conductor layer 16 is formed outwardly from gate insulator layer 14. Although gate insulator layer 14 and gate conductor layer 16 are shown as being formed without interfacial layers between them, such interfacial layers could alternatively be formed without departing from the scope of the present disclosure. Semiconductor substrate 12 may comprise any suitable material used in semiconductor chip fabrication, such as silicon, germanium, gallium arsenide, or other suitable semiconductive material. For purposes of teaching aspects of the present invention, an exemplary embodiment will be described that uses a substrate 12 comprising silicon.

In various embodiments, gate insulator layer 14 may comprise layers of silicon dioxide, silicon nitride, or combination thereof. Gate insulator layer 14 may be formed outwardly on the surface of semiconductor substrate 12 using any of a variety of processes. For example, gate insulator layer 14 may be formed by growing an oxide or nitrided oxide layer. In various embodiments, gate insulator layer 14 comprises a grown oxide with a thickness on the order of approximately 8 to 100 Angstroms. As oxide is grown on the surface of substrate 12, a portion of substrate 12 is consumed. Following the oxidation process, nitrogen can be incorporated into gate insulator layer 14 through plasma or thermal nitridation.

Gate conductor layer 16 is formed outwardly on the surface of gate insulator layer 14 and may comprise a layer of amorphous silicon or alloy, polycrystalline silicon or alloy, or other appropriate conductive material used in the fabrication of semiconductor structures. Gate conductor layer 16 may be formed by any of a variety of techniques including chemical vapor deposition (CVD) and physical vapor deposition (PVD). For example, gate conductor layer 16 may be formed by depositing a desired amount of polycrystalline silicon over the gate insulator layer 14. In particular embodiments, it may be desirable that gate conductor layer 16 is on the order of 1000 to 1600 Angstroms in thickness.

In some embodiments, after forming gate conductor layer 16, gate conductor layer 16 may be doped to increase gate conductance. The implant species used to dope gate conductor layer 16 depends at least in part on the conductivity type of the active area formed within semiconductor substrate 12. In one particular embodiment, the active area formed within substrate 12 comprises an n-type well. In that embodiment, gate conductor layer 16 is doped using an p-type implant.

Figure 1B:
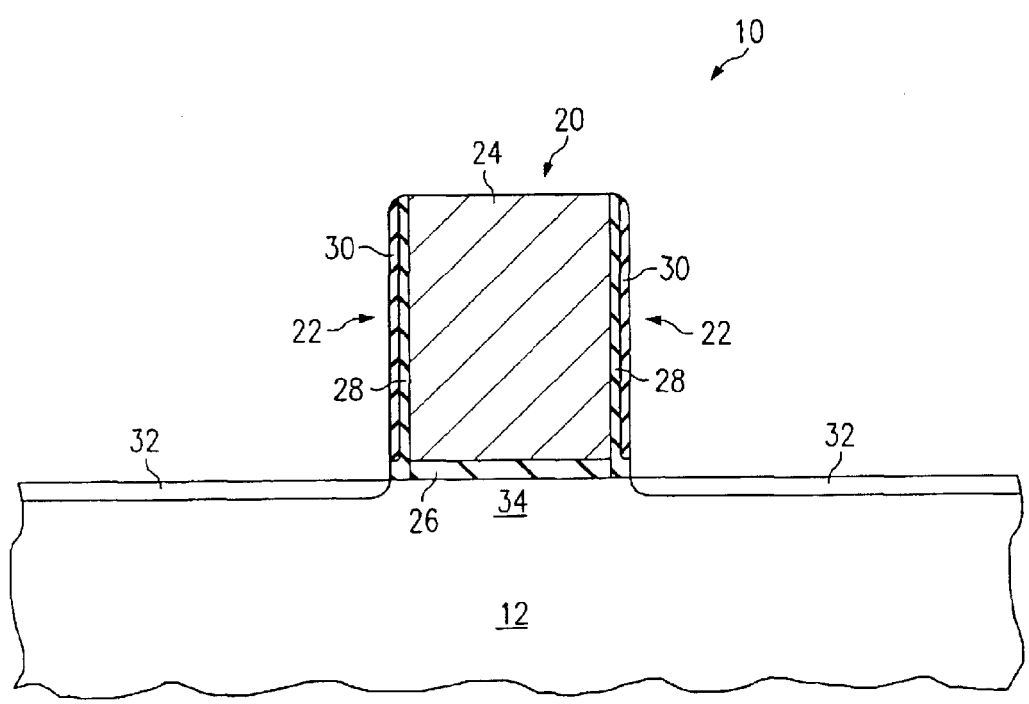
FIG. 1B is a cross-sectional view of the semiconductor structure after the formation of a gate stack and a sidewall spacer on the outer surface of the semiconductor structure.

At some point, a gate stack may be formed from gate insulator layer 14 and gate conductor layer 16. FIG. 1B is a cross-sectional view of semiconductor structure 10 after the formation of a gate stack 20 and a sidewall spacer 22 on the outer surface of semiconductor structure 10. The gate includes a gate conductor 24 and a gate insulator 26. The formation of semiconductor gate stack 20 may be effected through a variety of processes. For example, semiconductor gate stack 20 may be formed by patterning and etching gate conductor layer 16 and gate insulator layer 14 using suitable photolithographic methods including photo resist mask and anisotropic etch techniques. In particular embodiments, gate stack 20 has a width on the order of approximately 240 to 600 Angstroms and a height of approximately 1600 Angstroms. It is recognized, however, that gate stack 20 may be of any appropriate dimensions suitable for the fabrication of semiconductor structures.

After the etching or patterning of gate conductor layer 16 and gate insulator layer 14 to form gate stack 20, a sidewall spacer 22 is formed proximate to the sidewalls of gate stack 20. According to particular embodiments, sidewall spacer 22 includes an intermediate layer 28 and a spacer layer 30. Although intermediate layer 28 and spacer layer 30 are shown as being formed without interfacial layers between them, such interfacial layers could alternatively be formed without departing from the scope of the present disclosure. Further, it is also recognized that sidewall spacer 22 may comprise only spacer layer 30, and in certain embodiments, intermediate layer 28 may be omitted. Where included, intermediate layer 28 may comprise a thin layer and may comprise oxide, oxi-nitride, silicon dioxide, or other suitable material used in the fabrication of semiconductor devices. In particular embodiments, intermediate layer 28 comprises silicon dioxide with a thickness on the order of 50 Angstroms. Forming intermediate layer 28 may be affected through any of a variety of processes. For example, intermediate layer 28 can be formed by thermally growing an oxide. Using a grown oxide as intermediate layer 28 may be advantageous in providing a mechanism for removing surface irregularities in substrate 12 and gate conductor 24 created during the formation of gate stack 20.

Spacer layer 30 may comprise any dielectric material, such as, for example, nitride, silicon nitride, oxide, oxi-nitride, silicon dioxide, or any other suitable material used in semiconductor fabrication. In various embodiments, intermediate layer 28 comprises a dielectric material that is selectively etchable from spacer layer 30. That is, each of intermediate layer 28 and spacer layer 30 can be removed using an etching that does not significantly affect the other. For example, intermediate layer 28 may comprise a layer of oxide while spacer layer 30 may comprise, for example, nitride. In this example, spacer layer 30 comprises nitride with a thickness on the order of 50 Angstroms. Forming spacer layer 30 may be affected, for example, by depositing a dielectric material outwardly from intermediate layer 28.

After the formation of intermediate layer 28 and spacer layer 30, sidewall spacers indicated generally at 22 are formed on opposite sides of gate stack 20 by anisotropically etching intermediate layer 28 and offset layer 30. In one particular embodiment, portions of intermediate layer 28 and offset layer 30 are removed by performing a suitable plasma etch process. At some point, after sidewall spacers 22 are formed, source drain extension regions 32 of semiconductor structure 10 are created near the outer surface of substrate 12. In various embodiments, source drain extension regions 32 may comprise a relatively low doping concentration of boron, phosphorous, and/or arsenic dopants. Source drain extension regions 32 may be formed by low-energy ion implantation, low-energy diffusion, or by any other appropriate technique for doping substrate 12. Extension areas 32 may be formed, for example, prior to removal of portions of intermediate layer 28 and offset layer 30. In other embodiments, extension areas 32 may be formed after removal of at least a portion of intermediate layer 28 and offset layer 30. Forming extension areas 32 prior to removal of intermediate layer 28 is advantageous in minimizing damage to semiconductor substrate 12 during the formation of extension areas 32 by substantially preventing implant channeling in substrate 12. Forming extension areas 32 after removing intermediate layer 28, however, may result in a lower parasitic resistance as intermediate layer 28 may trap dopant and cause dopant loss.

The implantation of the dopants is self-aligned with respect to the outer edge of sidewall spacer 22. Thus, prior to high temperature processes, source drain extension regions 32 initiate from points within substrate 12 that correspond approximately with the outward edges of sidewall spacers 22. Source drain extension regions 32 are separated by channel region 34 also defined in semiconductor substrate 12. At some point after formation, however, source drain extension regions 32 are activated by annealing semiconductor structure 10. The anneal step may be achieved using various parameters, such as a rapid thermal anneal (RTA) at a temperature on the order of approximately 900° C. to 950° C. for approximately 1 to 5 seconds.

Annealing and other high temperature processes may result in the lateral migration of each extension region 32 toward the opposing extension region 32. Thus, source drain extension regions 32 may migrate toward one another beneath gate stack 20, and the distance between opposing source drain extension regions 32 may be decreased. For example, under some high temperature processes, each extension region 32 may migrate laterally a distance of approximately sixty percent of a junction depth associated with the extension region 32. By one common measure, the junction depth of each extension region 32 corresponds to the point within substrate 12 at which the concentration of dopant is approximately 1E18 ions/cm$^3$. For example, if the junction depth for an extension region 32 is approximately 167 Angstroms as measured from the outward surface of substrate 12, the extension region 32 can be expected to migrate laterally a distance of approximately 100 Angstroms. If both source drain extension regions 32 on either side of gate stack 20 migrate laterally a distance of approximately 100 Angstroms, channel region 34 is reduced in length by approximately 200 Angstroms.

As semiconductor fabrication technology improves, overall device dimensions can be decreased and the width of gate stacks 20 is continually decreased. Accordingly, the decrease in length of channel region 34 caused by the lateral migration of source drain extension regions 32 becomes more critical as the width of gate stack 20 is reduced. If, for example, the width of gate stack 20 and, consequently, the length of channel region 34 is approximately 240 Angstroms and each extension region 32 laterally migrates approximately 100 Angstroms, the length of channel region 34 is reduced to approximately 40 Angstroms. The shorter channel regions 34 increase the transistor off-state leakage current and may eventually result in a short circuit between the source and drain of a device. An overlap of opposing source drain extension regions 32 beneath gate stack 20 gives rise to source gate and drain gate capacitance. The formation of sidewall spacers 22 on either sides of gate stack 20 prior to the implantation of extension regions 32, however, increases the distance that source drain extension regions 32 may migrate laterally before affecting transistor off-state leakage. As a result, the reduction in the length of the channel due to dopant diffusion and lateral migration during more aggressive high temperature processes, such as annealing, may be substantially alleviated by the use of spacers.

Figure 1C:
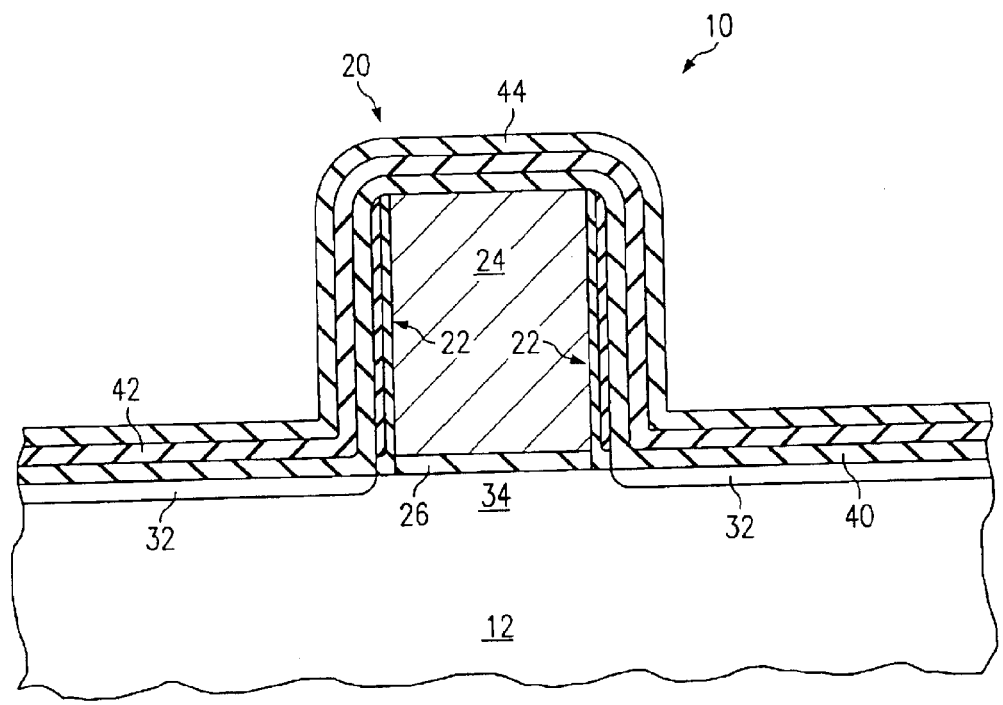
FIG. 1C is a cross-sectional view of the semiconductor structure after the formation of multiple layers on the outer surface of the gate stack and sidewall spacers.

FIG. 1C is a cross-sectional view of semiconductor structure 10 after formation of multiple layers on the outer surface of gate stack 20 and sidewall spacers 22. In the illustrated embodiment, the layers formed on the outer surface of gate stack 20 and sidewall spacers 22 include a first sidewall-forming layer 40, a second sidewall-forming layer 42, and a third sidewall-forming layer 44. The processes used to form each layer minimizes parasitic resistance, reduces junction depth, and minimizes lateral migration of extension region 32 by reducing the thermal budget associated with semiconductor structure 10. For example, the duration of heat cycles that a semiconductor structure 10 is subjected to may be reduced. In particular embodiments, various sidewall forming layers may be formed in environments lowering the thermal budget. Additionally or alternatively, the film properties of sidewall-forming layers 40 and 42 may minimize dopant loss from source drain extension region 32 to first sidewall-forming layer 40. Accordingly, parasitic resistance may be lowered.

According to particular embodiments, sidewall spacers 22 may include a first sidewall-forming layer 40 deposited outwardly on the surface of gate stack 20, sidewall spacers 22, and substrate 12. First sidewall-forming layer 40 may comprise, for example, oxide, oxi-nitride, silicon dioxide, nitride, or any other appropriate dielectric material. In this particular example, first sidewall-forming layer 40 comprises oxide with a thickness of approximately 50–300 Angstroms. First sidewall-forming layer 40 may be formed using any of a variety of processes. For example, first sidewall-forming layer 40 may be formed by depositing an oxide on the surface of gate stack 20 using conventional vapor deposition processes. Vapor deposition processes usually take place within a vacuum chamber and may include chemical or physical vapor deposition.

Using conventional semiconductor formation techniques, a semiconductor structure is typically placed in a furnace with other similar semiconductor structures after the deposition of a first sidewall-forming layer. In the furnace, the semiconductor structures undergo an extended heating process that typically lasts approximately three to four hours. The extensive duration of the batch heating process is due to the amount of time required to uniformly heat the batch of semiconductor structures to the desired temperature. The extensive duration of the batch heating process may also be due to a relatively low deposition rate with the precursors used. For example, a batch of semiconductor structures may be heated for approximately three to four hours to complete the deposition process at a temperature on the order of 600 to 800° C.

Because dopant implanted into a substrate during the formation of the source drain extension regions migrates both vertically and laterally during high temperature processes, the dopant profile of a substrate maybe altered during batch heating processes. Thus, it is desirable to reduce the temperature and duration of heating cycles performed on semiconductor structures after the deposition of the first sidewall-forming layer. According to particular embodiments, semiconductor structure 10 may be placed in a single wafer reactor. Because semiconductor structure 10 is placed in a single wafer reactor, the temperature and duration of the heating cycle may be substantially reduced. In particular embodiments, using such single wafer processes, semiconductor structures 10 may be heated to a temperature on the order of 600 to 700° C. using silane (or disilane) and nitrous oxide for approximately one to two minutes. In this manner, the thermal budget associated with the formation of first sidewall-forming layer 40 is reduced. Consequently, the lateral and vertical migration of dopant implanted in substrate 12 may be reduced. In alternative embodiments, a lower thermal budget may be achieved by lowering the deposition temperature and rate during a batch process with tetraethylorthosilicate (TEOS) or another suitable precursor. The lowering of deposition temperatures, however, generally leads to a higher hydrogen content in first sidewall-forming layer 40. Higher hydrogen content may result in increased dopant loss from source drain extension region 32.

Second sidewall-forming layer 42 is formed outwardly on the surface of first sidewall-forming layer 40. Second sidewall-forming layer 42 may comprise any dielectric material such as, for example, nitride, silicon nitride, oxide, oxi-nitride, silicon dioxide, or other suitable dielectric material. In one particular example, second sidewall-forming layer 42 comprises nitride with a thickness of approximately 100–500 Angstroms. Using a nitride as the dielectric material of second sidewall-forming layer 42 is particularly advantageous in controlling the etching process. Second sidewall-forming layer 42 may be formed in any of a variety of techniques including conventional deposition processes.

Conventional methods of forming sidewall layers, however, often lead to excessive dopant diffusion and deactivation due to the relatively high temperature needed to maintain a sufficient deposition rate of the dielectric material comprising second sidewall-forming layer 42. Conventional methods may also lead to higher contents of unstable hydrogen in the nitride film. Upon source drain activation anneal, hydrogen may diffuse into the underlying first sidewall-forming layer 40 and promote dopant loss from source drain extension region 32 to first sidewall-forming layer 40. In particular, conventional low pressure chemical vapor deposition (LPCVD) using a dichlorosilane (DCS) gas in the environment, typically requires a temperature of greater than 700° C. to maintain a sufficient deposition rate of the dielectric material. This high temperature imparts sufficiently high-energy to the dopants in substrate 12 to cause such dopants to migrate deeper into substrate 12 or into first sidewall-forming layer 40. This migration of dopants may result in dopant loss and deactivation of the semiconductor gate.

Unlike conventional methods of forming spacer layers, according to the teachings of certain embodiments of the present invention, formation of second sidewall-forming layer 42 occurs in an environment that comprises a relatively low temperature, while maintaining a sufficient deposition rate of the dielectric material. Forming second sidewall-forming layer 42 in a relatively low temperature substantially minimizes dopant loss and deactivation of the semiconductor gate stack 20. This lower temperature minimizes dopant migration. In addition to a decrease in the thermal budget, it may also be advantageous to form second sidewall-forming layer 42 of 15 to 35 percent carbon. Carbon in second sidewall-forming layer 42 may diffuse through first sidewall-forming layer 40 into source drain extension region 32 and aid in the retention of dopant in source drain extension region 32. Carbon in second sidewall-forming layer 42 may also enhance the permeability of hydrogen in first and second sidewall-forming layers 40 and 42. Higher hydrogen permeability allows for the reduction of hydrogen in layers 40 and 42 during a source drain activation anneal performed later in the process flow. Lower hydrogen content may lead to decreased dopant loss and lower parasitic sheet resistance in source drain extension region 32. Improved depth profiles are described in greater detail below with regard to FIG. 2.

The environment in which second sidewall-forming layer 42 is formed may comprise ammonia and/or any precursors that include carbon. For example, the environment may include bistertiarybutylaminosilane (BTBAS). The environment may be such that a sufficient deposition rate of the dielectric material is maintained at relatively low temperatures. In some embodiments, formation of second sidewall-forming layer 42 occurs at a temperature of 700° C. or less. For example, adequate deposition rates can be achieved in these environments at temperatures of 600° C. or less, 550° C. or less, or 500° C. or less.

Another aspect of certain embodiments of the present invention recognizes that a sufficient deposition rate can be maintained during the formation of second sidewall-forming layer 42 in a relatively low temperature environment without causing significant migration of dopants in the device, which may lead to deactivated regions. In particular embodiments, deposition of second sidewall-forming layer 42 in a BTBAS environment lowers the thermal budget associated with the fabrication of semiconductor structure 10. In particular embodiments where second sidewall-forming layer 42 includes carbon, carbon concentration may be varied in accordance with and as permitted by the particular deposition conditions.

In alternate embodiments of the present invention, an ammonia anneal step may be added prior to the deposition of first sidewall-forming layer 40. The ammonia anneal step may be performed for approximately 5–30 seconds at a temperature on the order of 550 to 700° C. As a result, nitrogen may be incorporated at the interface between source drain extension region 32 and first sidewall-forming layer 40. The nitrogen concentration may be dependent on the anneal temperature, the anneal duration, and/or the chemical oxide thickness of source drain extension region 32 prior to the deposition of first sidewall-forming layer 40. In certain embodiments, the concentration of nitrogen may be on the order of 2 to 15 percent. It is recognized, however, that the concentration of interfacial nitrogen may be of any amount sufficient to limit dopant migration, both vertically and laterally. An improved dopant depth profile for sidewall-forming layers formed after an ammonia anneal are described in greater detail below with regard to FIG. 2.

Third sidewall-forming layer 44 is formed outwardly on the surface of second sidewall-forming layer 42 and may comprise, for example, oxide, oxi-nitride, silicon dioxide, nitride, or other appropriate dielectric material. In particular embodiments, the thickness of third sidewall-forming layer 44 may be on the order of approximately 300 to 1,000 Angstroms. Formation of third sidewall-forming layer 44 may be affected using any of a variety of processes. In particular embodiments, third sidewall-forming layer 44 comprises an oxide film formed on the surface of second sidewall-forming layer 42. Although various chemical vapor deposition techniques may be used to deposit the oxide, it is generally recognized that many other known techniques may be used to form third sidewall-forming layer 44. In one example, third sidewall-forming layer 44 may be formed during a furnace batch process. The batch process may include an environment using tetraethylorthosilicate (TEOS) and oxygen at temperatures on the order of 550° to 700° C. In another example, third sidewall-forming layer 44 may be formed in a single wafer reactor. The environment in the single wafer reactor may include silane (or disilane) and nitrous oxide. The temperature in the single wafer reactor may be on the order of 550° C. to 700° C. As will be discussed in detail with regard to FIG. 1D, third sidewall-forming layer 44, first sidewall-forming layer 40, and second sidewall-forming layer 42 may be subsequently etched to form sidewall regions on opposing sides of gate stack 20.

The formation of third sidewall-forming layer 44 has been described as being formed using techniques similar to those described with regard to the formation of first and second sidewall-forming layers 40 and 42. Although these and other methods may be effective in reducing the thermal budget, it is generally recognized that the film properties associated with third sidewall-forming layer may be less critical to transistor performance than the film properties associated with first and second sidewall-forming layers 40 and 42.

Forming first sidewall-forming layer 40, second sidewall-forming layer 42, and third sidewall-forming layer 44 in a relatively low temperature environment to achieve desired film properties alleviates the problems conventionally associated with doped drain and extension areas during formation of these layers. One aspect of the present disclosure recognizes that forming layers 40, 42, and 44 with a relatively low thermal budget may substantially improve the semiconductor device by substantially minimizing dopant loss and deactivation of the drain and extension areas of the semiconductor device and the gate regions. Additionally or alternatively, second sidewall-forming layer 42 formed with carbon impurities and the use of the BTBAS for nitride deposition may minimize dopant loss. In other embodiments of the present invention, deposition of the above-mentioned sidewall bodies may be by plasma-enhanced chemical deposition (PECVD) techniques using similar precursors at even lower temperature.

Figure 1D:
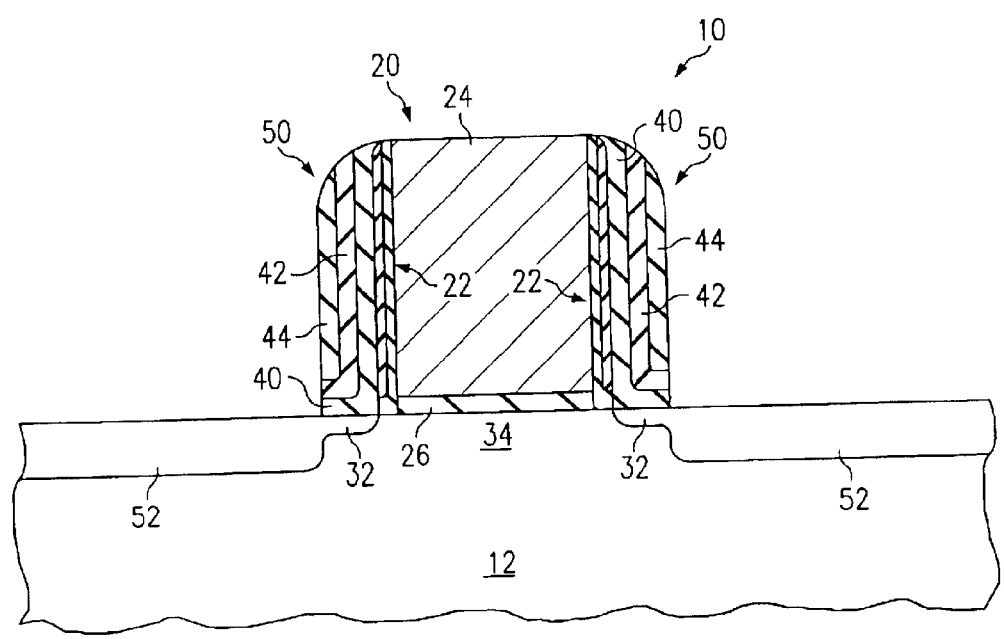
FIG. 1D is a cross-sectional view of the semiconductor structure after the formation of source drain regions in the surface of the semiconductor structure.

FIG. 1D is a cross-sectional view of semiconductor structure 10 after formation of source drain regions 52 in the surface of the semiconductor structure 10. After the outward formation of first sidewall-forming layer 40, second sidewall-forming layer 42, third sidewall-forming layer 44, and any other appropriate intermediate layers on gate stack 20 and sidewall spacers 22, sidewall bodies 50 are formed proximate to sidewall spacers 22. Sidewall spacers 22 may be formed by removing portions of layers 40, 42, and 44 by anisotropically etching layers 40, 42, and 44. In particular embodiments, portions of layers 40, 42, and 44 may be removed by performing a plasma etch.

After sidewall bodies 50 are formed, source drain regions 52 may be formed in the surface of substrate 12. In various embodiments, source drain regions 52 may comprise a relatively high doping concentration of boron, phosphorous, and/or arsenic dopants. Source drain regions 52 may be formed, for example, by deep ion implantation, deep diffusion, or by any other appropriate technique for doping substrate 12. During ion implantation, sidewall bodies 50 operate to protect source drain extension regions 32 disposed inwardly from gate 16. The implantation of the dopants is self-aligned with respect to the outer edges of sidewall bodies 50. Thus, prior to high temperature processes, source drain regions 52 initiate from points within substrate 12 that align with and correspond to the outward edges of sidewall bodies 50. The total thickness sidewall bodies 50 remaining after removal of a portion or portions of layers 40, 42, and 44 depends at least in part on a desired thickness necessary to protect substrate 12 and source drain extension regions 32 during formation of source drain regions 52.

At some point, source drain regions 52 and source drain extension regions 32 are activated by a second anneal step performed on semiconductor structure 10. The second anneal step is typically more aggressive than the anneal performed after the formation of extension regions 32. The second anneal step may be achieved using various techniques, such as a rapid thermal anneal (RTA) at a temperature on the order of approximately 1000° C. to 1050° C. for approximately 1 to 5 seconds. Similar to the first annealing step discussed above, the second annealing step, as well as any other high temperature processes performed on semiconductor structure 10, may result in the lateral migration of opposing source drain extension regions 32 and source drain regions 52 toward each other. As a result, the distance between source drain extension regions 32 and source drain regions 52 that comprises channel region 34 is further decreased.

Because the implantation of dopant to create the source drain regions 52 alters the dopant concentration profile of substrate 12 by gradually increasing the dopant concentration level of areas of the substrate 12 near the surface, the junction depth after the implantation of source drain region 52 is deeper within substrate 12 than the junction depth prior to the implantation of source drain region 52. A deeper junction depth increases lateral migration of source drain regions 52 and extension regions 32. The formation of first sidewall-forming layer 40, second sidewall-forming layer 42, and third sidewall-forming layer 44 prior to the etching of gate stack 20 to form sidewall bodies 50, however, further increases the distance that source drains 52 may migrate laterally before effecting junction capacitance and transistor off-state leakage current.

Figure 1E:
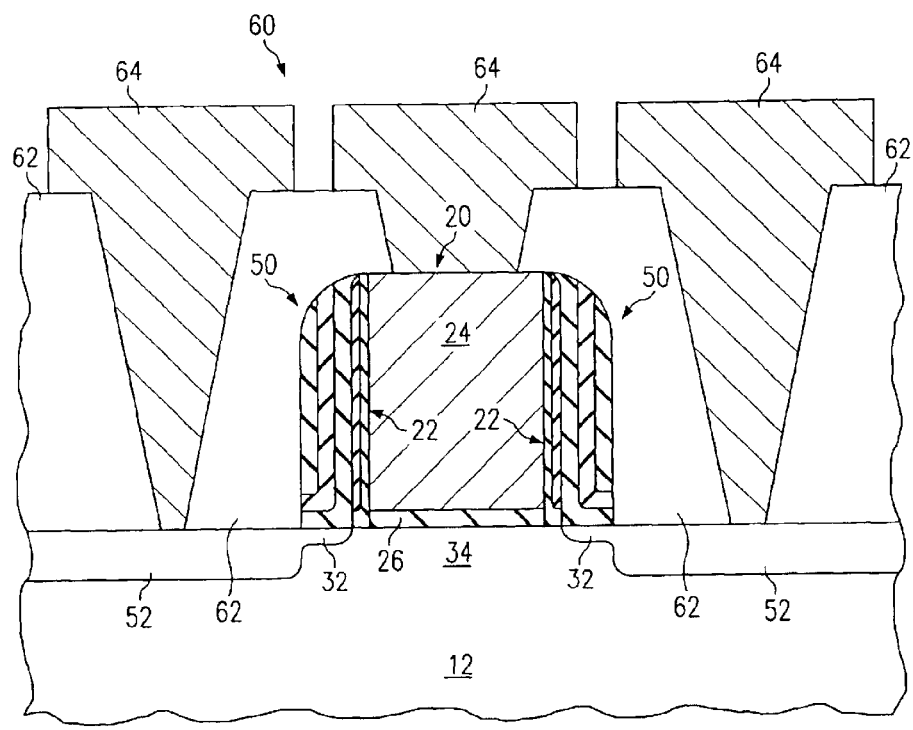
FIG. 1E is a cross-sectional view of a transistor formed in accordance with the teachings of the present invention.

FIG. 1E is a cross-sectional view of a transistor indicated generally at 60 formed in accordance with the teachings of the present invention. Transistor 60 includes gate conductor 24, gate insulator 26, extension regions 32, source drain regions 52, and a channel region 34 positioned as shown. Transistor 60 is shown after insulator or isolation insulator layer 62 is disposed on the outward surface of gate stack 20 and contacts 64*a, b*, and *c* are formed through at least a portion of substrate layer 62. As shown, transistor 60 is a field effect transistor, but transistor 60 may comprise any of a variety of semiconductor structures including a bipolar junction transistor, a NMOS transistor, a PMOS transistor, a CMOS transistor, or other semiconductor based transistor.

Transistor 60 includes a gate stack 20 patterned from multiple layers formed on the surface of semiconductor structure 10. Gate stack 20 and the layers disposed thereon may be formed according to various teachings of the present invention. For example, the processes used to form sidewall-forming layers 40, 42, and 44 minimize parasitic resistance, reduce junction depth, and/or prevent diode leakage by reducing the thermal budget associated with semiconductor structure 10. The thermal budget may be reduced by decreasing the duration and temperature of heating cycles performed on transistor 60. For example, after the formation of first sidewall-forming layer 40, transistor 60 may be heated in a single wafer reactor. The thermal budget for layer 42 may be reduced by forming one or more sidewall-forming layers in a BTBAS environment. Additionally or alternatively, the formation of second sidewall-forming layer 42 may also include the introduction of carbon impurities. Accordingly, dopant loss may be minimized and the deactivation of the drain extension areas may be reduced during the formation of sidewall-forming layers. From various layers, sidewall spacers 22 are formed on opposing sides of transistor 60. Similarly, sidewall bodies 50 are formed outwardly from sidewall spacers 22 on opposing sides of transistor 60.

In the illustrated embodiment, transistor 60 is shown as including isolation insulator layer 62 disposed on the outward surface of gate stack 20 and a contact 64 formed through at least a portion of isolation insulator layer 62. Isolation insulator layer 62 may be formed using a physical vapor deposition technique or by any appropriate technique known or available. In particular embodiments, isolation insulator layer 62 may be formed using a plasma-enhanced chemical vapor deposition. Isolation insulator layer 62 typically includes a dielectric material. For example, isolation insulator layer 62 may comprise fluorinated silicate glass, organosilicate glass, or any other appropriate polymer. In particular embodiments, isolation insulator layer 62 may comprise fluorinated silicate glass, organosilicate glass, methyl silsequioxane (MSQ), hydrogen silsequioxane (HSQ), or other appropriate silicate polymer.

Transistor 60 includes a contact 64 formed in isolation insulator layer 62. The contact 64 may be formed using a conventional etching process. For example, anisotropic etch processes using gases and plasma energy may be used. The contact 64 may then be filled with one or more layers of conductive material to allow interconnection between two semiconductor components. Conductive materials commonly used to fill contact 64 include copper. It is generally recognized, however, that copper is merely exemplary, and any conductive material may be used to form contact 64.

Figure 2:
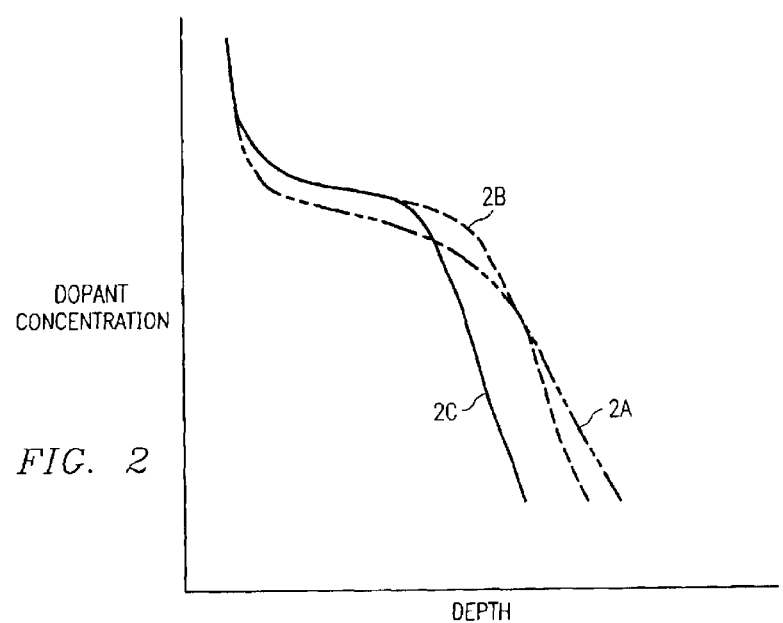
FIG. 2 is a schematic drawing illustrating the effect of varying sidewall spacer films on dopant depth profiles.

FIG. 2 is a schematic illustrating the effect of varying sidewall spacer films on dopant depth profiles. Specifically, line 2A represents the dopant depth profile for conventional sidewall spacer films. Line 2B represents the dopant depth profile for sidewall spacer films formed using the techniques of the present invention to improve dopant concentration and reduce dopant junction depth. For example, formation of second sidewall-forming layer 42 may occur in an environment that comprises a relatively low temperature, while maintaining a sufficient deposition rate of the dielectric material comprising second sidewall-forming layer 42. Forming one or more spacer layers at a relatively low temperature may substantially minimize dopant loss and deactivation of the semiconductor gate stack 20. The lower temperature decreases the thermal budget and minimizes dopant migration. In particular embodiments, second sidewall-forming layer 42 may include carbon to enhance the permeability of hydrogen in first sidewall-forming layer 40. A lower hydrogen content in first sidewall-forming layer 40 may further decrease dopant loss while lowering parasitic sheet resistance. Improved dopant concentration in Line 2B is depicted by a sharper or steeper decrease over an increase in depth.

Line 2C represents the dopant depth profile for sidewall spacer films at least partially formed after an ammonia anneal step. In certain embodiments of the present invention, the ammonia anneal step is performed before the deposition of first sidewall-forming layer 40. The ammonia anneal step results in the incorporation of nitrogen between source drain extension region 32 and first sidewall-forming layer 40. The presence of interfacial nitrogen limits dopant migration, both vertically and laterally, and further reduces dopant junction depth. Improved dopant concentration is depicted in Line 2C by a sharper or steeper decrease over an increase in depth.

Although the present invention has been described in detail, it should be understood that various changes, alterations, substitutions, and modifications can be made to the teachings disclosed herein without departing from the spirit and scope of the present invention which is solely defined by the appended claims.

What is claimed is:

1. A method of forming a semiconductor device, comprising:

forming a gate stack on a semiconductor surface wherein said gate stack comprises vertical sides;

forming one or more sidewall spacer layers on said vertical sides of said gate stack;

doping at least one region in said semiconductor surface adjacent to said sidewall spacers;

forming first and second sidewall bodies on opposing sides of the gate stack, wherein the formation of the first and second sidewall bodies comprises:

forming a first sidewall-forming layer outwardly from said sidewall spacer layers;

exposing the semiconductor device to a heating cycle in a single wafer reactor; and forming a second sidewall-forming layer on the outward surface of the first sidewall-forming layer, the formation of the second sidewall-forming layer occurring in an environment comprising bistertiarybutylaminosilane (BTBAS) that substantially minimizes dopant loss and deactivation in the at least one region of the partially formed semiconductor device.

2. The method of claim 1, wherein the at least one of the one or more sidewall spacer layers comprises a dielectric material selected from a group consisting of nitride, oxide, oxi-nitride, and silicon dioxide.

3. The method of claim 1, wherein the at least one region of the partially formed semiconductor device comprises an extension region.

4. The method of claim 1, wherein the first sidewall-forming layer comprises dielectric material selected from a group consisting of oxide, oxi-nitride, or silicon dioxide.

5. The method of claim 4, wherein the semiconductor device is placed in the single wafer reactor for approximately one to two minutes.

6. The method of claim 1, wherein the temperature in the single wafer reactor is approximately 600 to 700° C.

7. The method of claim 4, wherein the semiconductor device is placed in a batch furnace at a reduced deposition temperature on the order of 500 to 600° C.

8. The method of claim 1, wherein the second sidewall-forming layer comprises a dielectric material selected from a group consisting of oxi-nitride or nitride.

9. The method of claim 1, wherein forming the second sidewall spacer layer comprises introducing carbon impurities of a concentration on the order of 3 to 15 percent.

10. The method of claim 1, wherein the semiconductor device comprises a transistor.

11. The method of claim 1, further comprising implanting first and second source drain regions into the substrate, the first and second source drain regions self-aligned relative to an outward surface of the first and second sidewall bodies.

12. The method of claim 1, further comprising forming first and second sidewall spacers on opposing sides of the gate stack, the first and second sidewall spacers formed before forming first and second source drain extension regions, the first and second source drain extension regions self-aligned relative to an outward surface of the first and second sidewall spacers, respectively.

* * * * *